356-138

SEARCH ROOM

T365

March 30, 1965 H. DA COSTA 3,175,458

OPTICAL APPARATUS FOR POSITIONING A WORKPIECE

Filed Feb. 23, 1960

INVENTOR.
Harry da Costa,
BY Mueller & Aichele
Atty's.

United States Patent Office 3,175,458

Patented Mar. 30, 1965

3,175,458

OPTICAL APPARATUS FOR POSITIONING A WORKPIECE

Harry da Costa, Phoenix, Ariz., assignor to Motorola, Inc., Chicago, Ill., a corporation of Illinois Filed Feb. 23, 1960, Ser. No. 10,328
5 Claims. (Cl. 88—14)

This invention relates generally to optical apparatus for facilitating the positioning of a miniature workpiece such that a selected surface of the workpiece is parallel to a reference plane.

More specifically, the invention is directed to an optical system which has a pair of alignment targets or symbols, preferably in the form of crosses, which are viewed through a microscope when a miniature workpiece such as a tiny semiconductor body of a transistor assembly is supported on a positioning or leveling device in the field of the microscope, the optical system being constructed such that when a selected surface of the workpiece is parallel to a predetermined reference plane the two crosses are in alignment, and when the surface is tilted with respect to the reference plane the two crosses are offset.

Certain manufacturing processes involve steps or operations in which a surface to be worked on must be in an exact angular position with respect to an object which performs the work. An example is a particular process for manufacturing miniature semiconductor devices such as high frequency transistors. At one stage of the fabrication of certain high frequency devices called "Mesa" transistors, an extremely small active region is formed on a surface of a semiconductor body by selectively etching material away from the body in an area surrounding the desired active region. This etching has been accomplished most effectively by a jet etching machine described and claimed in a copending application of Harry da Costa Serial No. 849,053, filed on October 27, 1959, now Patent No. 3,086,936. The machine includes a special etching head having a double-nozzle construction which applies obturating gas to the area of the semiconductor body selected for the active region, and applies etching liquid called electrolyte to the peripheral area surrounding the active region. Current is passed through the liquid electrolyte causing it to etch material away from the peripheral area to a selected depth, and the obturating gas protects the active region so that it is not etched.

It has been found that the surface of the semiconductor body to be etched should be precisely parallel to the end of the nozzle structure of the etching head in order for the etched and unetched areas to be formed with the desired sizes and configurations. However, the active region which is formed by the etching is extremely small and has about the same cross-sectional area as an average human hair. From this it is apparent that it is not possible, as a practical matter, to determine by merely viewing the surface to be etched whether it is or is not parallel to the end of the etching head, even if the surface is viewed through an ordinary microscope. Furthermore, no equipment has been available which is adapted to position the semiconductor body precisely and provide information as to when the surface of the semiconductor body to be etched is in the exact position in which it will be parallel to the end of the nozzle structure of the etching head as described above.

An object of the present invention is to provide an optical system for use in positioning a miniature workpiece which will show the angular position of a surface on the workpiece with respect to a reference plane, and which will show clearly and with precision when a plane of the surface is parallel to the reference plane.

Another object of the invention is to provide an optical system for facilitating adjustment of a workpiece to a position in which a planar surface of the workpiece is parallel to a reference plane, and which makes it possible for the adjustment to be made rapidly and yet precisely by relatively unskilled labor so that the apparatus will lend itself to economical mass production of the workpieces and assemblies provided with the workpieces.

Another object of the invention is to provide optical apparatus for use with a leveling jig which receives an assembly for a semiconductor device and positions it such that a surface of a semiconductor body included in the assembly is properly oriented for subsequent processing, with the optical apparatus being capable of accommodating maximum manufacturing tolerances of the assembly without adversely affecting the results of the leveling operation.

A further object is to provide optical apparatus which is capable of accepting a workpiece that has a planar surface which initially may be tilted at a substantial angle with respect to a reference plane, and which will show directly and without requiring random searching how the position of the workpiece can be adjusted so that the surface will be parallel to the reference plane after adjustment.

A feature of the invention is the provision of an optical system which has a reference symbol representing a reference plane, and an alignment symbol which represents the position of a surface on a workpiece relative to the reference plane, the optics of the system being arranged such that the position of the alignment symbol relative to the reference symbol changes as the surface of the workpiece is adjusted to different angular positions, and the alignment symbol has an easily recognizable relation to the reference symbol when the workpiece has been adjusted so that its surface is parallel to the reference plane.

Another feature of the invention is the provision of optical apparatus including a microscope having cross hairs which represent a reference plane, and a light source constructed and supported such that it is adapted to shine a cross of diffused light onto a surface of a workpiece positioned in the field of the microscope, such that the light cross is visible through the microscope and follows the angular movement of the workpiece as it is adjusted angularly, and when the light cross is aligned with the cross hairs of the microscope the surface of the workpiece is parallel to the reference plane.

Another feature of the invention is the provision of optical apparatus which has cross hairs and a light cross as described above, with the optical apparatus being arranged such that the focus of the microscope is not a critical factor in the results of the leveling operation. Because of this, the devices or workpieces to be leveled can have substantial dimensional variations from one unit to another without adversely affecting the results of the leveling operation.

Another feature of the invention is the provision of optical apparatus which has a reference cross and an alignment cross formed by diffused light as described above, with the diffused light making it possible for the system to tolerate substantial variations in the position of the workpiece in the X and Y coordinates of the reference plane without adversely affecting the results of the leveling operation. Thus, it is not necessary to first position the workpiece in the X and Y directions before positioning it angularly as would be necessary if, for example, a point source of light were employed rather than a source of diffused light.

The invention is illustrated in the accompanying drawings in which.

Figures 1, 2, 3, 4, 5, 6, 7:
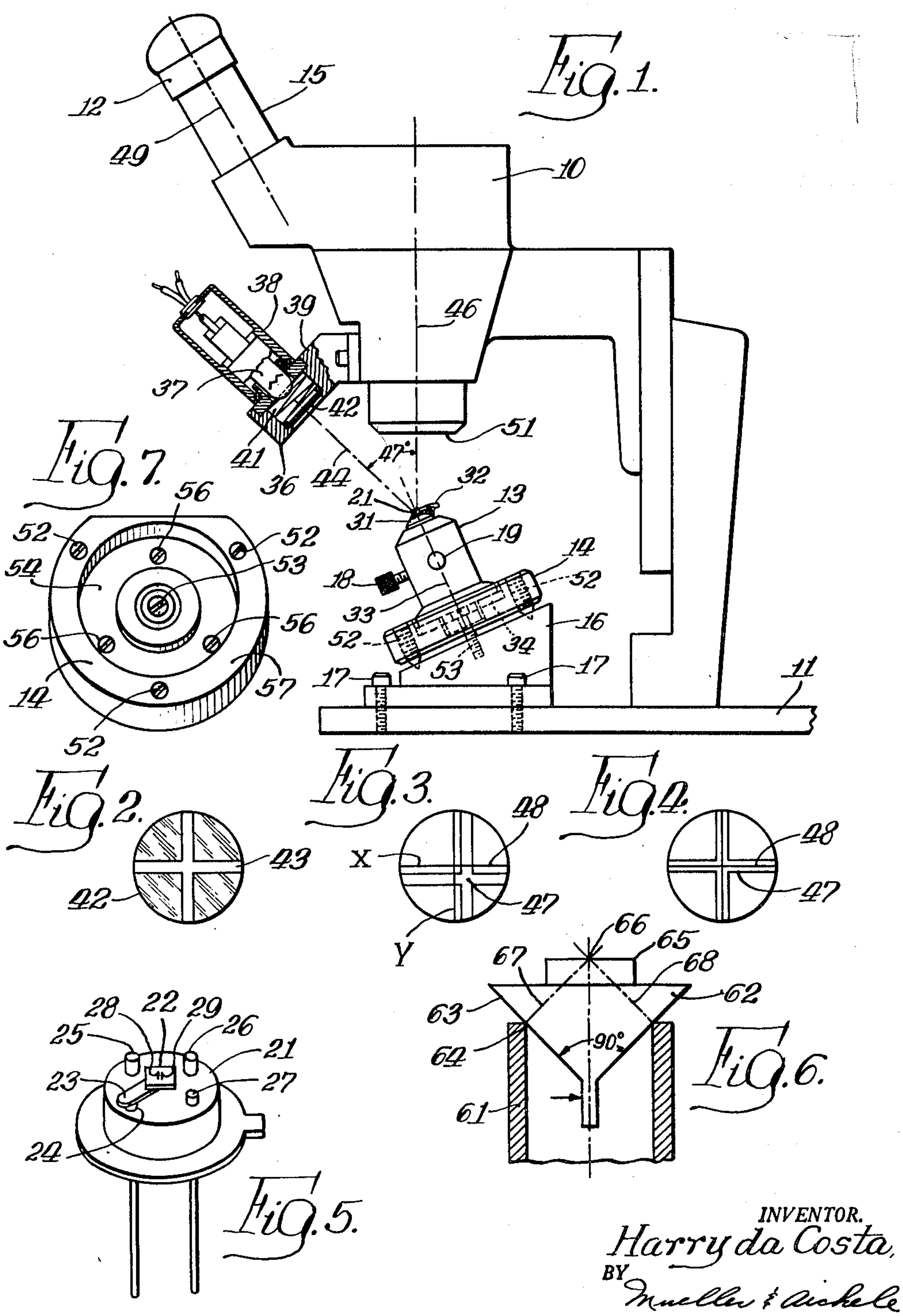
FIG. 1 shows an optical system in accordance with the invention including a light source, shown in section, which shines diffused light in the form of a cross on a semiconductor assembly supported on a leveling device, with the cross of light being visible through a microscope in superimposed relation with cross hairs provided in the microscope.
FIG. 2 shows a diffusing element provided in the light source of FIG. 1, the diffusing element being masked so as to allow light to pass through it in the form of a cross.
FIG. 3 is a schematic view illustrating the offset relation of the light cross with respect to the microscope cross hairs before the semiconductor unit included in the assembly supported on the leveling device of FIG. 1 has been leveled.
FIG. 4 is a schematic view illustrating the aligned relation of the light cross and the microscope cross hairs after the semiconductor unit has been leveled by adjusting the leveling device of FIG. 1.
FIG. 5 is a perspective view of the semiconductor assembly illustrating the condition of the assembly at the stage of fabrication when the leveling operation is carried out by means of the apparatus of FIG. 1.
FIG. 6 is a schematic diagram which illustrates the structural principles of the leveling device shown in FIG. 1.
FIG. 7 is a perspective view of a cradle included in the apparatus of FIG. 1 which receives and supports the levelling device.

Referring first to FIG. 1, the optical apparatus of the invention includes a microscope 10, preferably of the binocular type, mounted on a suitable support 11 such that an operator can conveniently look through the eyepiece or eyepieces 12 and at the same time adjust a leveling device 13 which is placed under the microscope. The leveling device 13 is received and supported by a cradle 14 provided on a pedestal 16 which is secured to the support 11 as by the screws 17. The leveling device 13 has a pair of adjusting knobs 18 and 19 which are turned by the operator in order to adjust the position of a semiconductor assembly which is placed on the top of the leveling device 13 before the leveling device is placed on the cradle 14.

The semiconductor assembly 21 is shown greatly enlarged in FIG. 5, and includes a tiny semiconductor body 22 mounted on a heat sink 23 which is secured to the upper end of an electrical lead 24. The assembly 21 is for a high frequency transistor device of the type known as a "Mesa" transistor, and the semiconductor body 22 is the active part of the transistor. The electrical leads 24, 25, 26 and 27 are respectively the collector, base, emitter and ground leads for the transistor. In the completed transistor, the base lead 25 and the emitter lead 26 are respectively connected to two tiny electrodes in the form of strips 28 and 29 by contact wires, but these wires are not shown in FIG. 5 since this view shows the condition of the assembly as it is supplied to an etching machine, and at this stage of the fabrication the wires have not been attached to the assembly.

The etching machine is described fully in the aforementioned copending application, and only a brief description of the etching operation will be given here. The machine includes an etching head having a double-nozzle structure which applies etchant to the semiconductor body 22 in the form of a hollow stream of electrolyte surrounding a jet of gas. The semiconductor body 22 is supported so that its upper surface is closely spaced from the end of the nozzle structure, and the gas issuing from the nozzle is directed onto the strips 28 and 29 whereas the stream of electrolyte surrounding the gas is directed onto the area of the body surrounding the strips 28 and 29. The gas is under pressure and forces the electrolyte to flow radially away from the strips. Current is passed through the electrolyte causing it to etch a channel-like depression or moat into the semiconductor body 22, and this depression or moat extends around the strips 28 and 29 forming a projection which is the active region of the semiconductor body.

If the upper surface of the body 22 is tilted even very slightly with respect to the end of the nozzle structure which applies the gas and electrolyte to it, the etched and unetched areas are not formed with the desired configuration and dimensions. Therefore, before the assembly 21 is supplied to the etching machine, it is placed on the leveling device 13, and the leveling device is placed in the optical apparatus of FIG. 1 and a leveling operation is performed.

Stated briefly, the purpose of the leveling operation performed in the apparatus of FIG. 1 is to position the assembly 21 so that the upper surface of the semiconductor body 22 is parallel to a reference plane which may be considered as the plane of the bottom 34 of the leveling device 13 or as the plane of the end of the etching head described above. If the upper surface of the body 22 is parallel to the plane of the bottom 34 of device 13, it will also be parallel to the end of the etching head when the device 13 is placed in the etching machine and the etching head is positioned with its end parallel to the bottom 34 of device 13.

The optical apparatus of FIG. 1 makes it possible for the operator to determine when the upper surface of the semiconductor body 22 is parallel to the reference plane. In addition to the microscope 10, the optical apparatus includes a light source 36 which shines diffused light in the form of a cross onto the surface of the semiconductor body 22. The light source 36 includes a lamp 37 in a light-proof cartridge 38 secured to a bracket 39 which is attached to the microscope 10. The bracket 39 has an opening 41 extending through it, and a diffusing element 42 closes the end of this opening. The cartridge 38 and the hollow bracket 39 form an enclosure for the lamp 37, and light is emitted from the enclosure only through the diffusing element 42.

The diffusing element 42 is preferably a plate of ground glass or other suitable diffusing material which is masked as illustrated by the shaded areas in FIG. 2 so as to form an unmasked area in the form of a cross 43. It is this unmasked area 43 which causes the light from the lamp 37 to be emitted from the source 36 in the form of a cross of diffused light. The diffusing element 42 has an axis 44, and the lamp 37 is positioned on this axis so that the cross of light provided by the source 36 is directed along the axis 44. The axis 44 intersects the optical axis 46 of the microscope 10 at an angle 50.

The leveling device 13 is supported by the cradle 14 in a position such that the surface of the semiconductor body 22 is located at the intersection of the axis 44 and the optical axis 46. The semiconductor assembly 21 is seated on a tiltable carrier 31 which extends from the top of the leveling device 13, and the assembling is held in place by a spring biased clip 32. The device 13 has an axis 33 which is perpendicular to the bottom 34, and the body 22 normally has its center on the axis 33. The carrier 31 can be tilted in any plane about the axis 33 by turning the knobs 18 and 19, and this alters the angular position of the upper surface of the body 22 with respect to the reference plane. The device 13 is supported such that the axis 33 bisects the angle 50, and thus when the upper surface of the body 22 is parallel to the plane of the bottom 34 of device 13, the light from the source 36 is reflected from the body 22 into the microscope such that the center of the light cross is projected along the optical axis 46. The light cross is visible through the microscope and has the appearance in the case just described of the cross 47 as illustrated in FIG. 4. Before the body 22 is leveled, however, its upper surface is ordinarily tilted slightly with respect to the reference plane because of unavoidable manufacturig tolerances. Thus, as the light is reflected from the unleveled surface, the center of the light cross is not projected along the optical axis 46, and in this case the light cross as viewed through the microscope has the appearance of the cross 47 as illustrated in FIG. 3. The microscope 10 is provided with a reticle in the form of cross hairs which are also visible through the microscope and have the appearance of the cross 48 in FIGS. 3 and 4. The cross hairs are provided in the tube 15 and are parallel to the reference plane which may be considered as the bottom 34 of the leveling device. Thus, the visible cross 48 illustrated in FIG. 3 represents the reference plane.

The position of the light cross 47 with respect to the reference cross 48 tells the operator whether the upper surface of the semiconductor body 22 is or is not parallel to the reference plane. When the light cross 47 is offset from the reference cross 48 such as illustrated in FIG. 3, the surface of the semiconductor body is tilted with respect to the reference plane. When the alignment cross 47 is aligned with the reference cross 48 as illustrated in FIG. 4, the upper surface of the semiconductor body is exactly parallel to the reference plane. The operator can perform the leveling operation quickly and precisely merely by turning the knobs 18 and 19 until the two crosses 47 and 48 are in alignment as shown in FIG. 4.

The directions in which the adjusting knobs 18 and 19 extend from the leveling device 13 correspond to the X and Y coordinates of the reference plane as represented by the arms of the reference cross 48. The knob 19 corresponds with the X coordinate of cross 48. When this knob is adjusted, the light cross 47 moves left or right along the X coordinate as viewed in FIG. 3. The knob 18 corresponds to the Y coordinate, and when this knob is adjusted the light cross 47 moves up or down along the Y coordinate as illustrated in FIG. 3. Thus, the position of the light cross 47 with respect to the reference cross 48 tells the operator how to adjust the knobs 18 and 19 so as to bring the cross 47 into alignment with the cross 48.

Since the light source 36 provides diffused light, it is not essential for the surface of the body 22 to have its center exactly on the optical axis 46. This is because the dimensions of the light cross are quite gross compared with the dimensions of the surface of the body 22 being leveled. By way of comparison, if a point source of light were employed, it would be necessary for the body 22 to be centered with respect to the optical axis. Furthermore, it is possible to obtain the necessary light intensity from the diffused light source 36 much easier than from a point source of light.

Another important aspect of the optical system is that the focus of the microscope 10 is not a critical factor in the results of the leveling operation. The distance between the semiconductor body 22 as it is supported on the leveling device 13 and the object piece 51 of the microscope is about one-half the focal length of the microscope, and this relationship is not adjustable once the optical system has been set up. The diffusing element 42 is located at a distance from the semiconductor body 22 of about one to one and one-half times the focal length of the microscope. However, the proper functioning of the apparatus does not in any way depend upon precise maintenance of the focal length of the microscope with respect to the light path. Actually, the semiconductor unit 22 is not visible through the microscope because it is out of focus, and what is actually seen through the microscope is an image of the light cross provided by the source 36 superimposed on the cross hairs of the microscope. Since the results of the leveling operation do not depend upon the focus of the microscope, the optical apparatus will accept assemblies 21 which have substantial dimensional variations from one unit to another.

In order to set up the optical apparatus so that the surface of the semiconductor body 22 will be exactly parallel to the reference plane when the two crosses 47 and 48 are in alignment, a cylindrical block having flat polished ends perpendicular to its axis is placed in the cradle 14 instead of the leveling device 13. This cylindrical block has the same length as the total length of the leveling device 13 plus the height of the semiconductor assembly 21 as it is supported on the carrier 31. With the cylindrical block in place in the cradle 14, the position of the microscope and the light source 36 are adjusted to establish the desired distances from the light source to the workpiece and from the microscope to the workpiece as described above. After these relationships are established, the microscope is permanently fixed. With the lamp 37 turned on, the operator views the light cross 47 and the reference cross 48 through the microscope. If the two crosses are initially offset, as would be expected, the position of the cradle 14 is adjusted by turning three leveling screws 52 which are threaded through the cradle and abut against the pedestal 16. When the leveling screws 52 have been properly adjusted, the light cross 47 is in alignment with the reference cross 48, and then a clamp screw 53 in the center of the cradle 14 and threaded into the pedestal 16 is tightened such that it pulls the cradle 14 tightly against the pedestal 16 and clamps it in place. The cradle 14 is now properly adjusted so as to receive the leveling device 13 with the semiconductor body 22 in place such that when the device is adjusted to bring the two crosses 47 and 48 into alignment, the upper surface of the body 22 will be parallel to the reference plane provided by the bottom of the leveling device 13. It may be seen in FIG. 7 that the cradle 14 has a recessed bottom 54 with three raised parts 56 on the bottom of the cradle. The bottom 34 of the leveling device 13 fits snugly against the three raised parts 56 and is centered by the raised wall 57.

The structural principles of the leveling device 13 are illustrated in FIG. 6. The device 13 includes a supporting structure or stand represented in FIG. 6 by a tubular structure 61. The carrier 31 is represented by a conically shaped body 62. The conical surface 63 of the body 62 forms an angle at its apex of 90°, and the surface 63 is slidable on a circular bearing portion 64 at the top of the tubular body 61. Thus, the body 62 may be rotated on the supporting structure 61, and this rotational movement is provided by the two adjusting screws 18 and 19 which are represented by an arrow in FIG. 6. The center of rotation 66 of the body 62 remains fixed as the body rotates. This center of rotation is at the intersection of the two construction lines 67 and 68 which are perpendicular to the conical surface 63 and extend through the points of engagement between the surface 63 and the bearing portion 64. The block 65 on the carrier body 62 represents the workpiece, which is the semiconductor body 22 of the assembly 21. It may be noted that the upper surface of the workpiece 65 is at the center of rotation 66, and thus the angular position of this surface can be adjusted without changing the position of the center of the surface. For this reason, the semiconductor body 22 only moves angularly when the adjusting knobs 18 and 19 are turned, and this means that it does not deviate from its desired position in the optical field of the microscope 10.

It is apparent from the foregoing description that the optical apparatus of the invention makes it possible to perform the leveling operation quickly and conveniently, and thus makes a major contribution to the manufacture of semiconductor devices as described above on a mass production basis. The apparatus provides precise leveling, and yet does not require the use of highly skilled labor for the leveling operation. The apparatus will readily accept the maximum dimensional variations of the semiconductor devices, and provides exact leveling for each unit despite these dimensional variations. The apparatus is not critical with respect to the focus of the microscope and other parameters, and this means that it requires a minimum of maintenance and adjustment which helps to minimize operating costs.

I claim:

1. Optical apparatus for facilitating angular positioning of a workpiece of microscopic size relative to a reference plane, said optical apparatus including in combination, a microscope having a reticle therein providing a reference cross which is visible through the microscope and represents the reference plane, means for supporting the workpiece in the field of said microscope with a selected surface thereof on the optical axis of said microscope, a light source providing diffuse light in the form of a cross whose dimensions are gross compared to the dimensions of the workpiece, said light source being supported in a position offset from the optical axis of said microscope and oriented such that the cross of diffuse light is directed towards the mounting position for the workpiece and at an angle with respect to the optical axis of the microscope such that the selected surface of a workpiece supported as aforesaid reflects light into the microscope forming an illuminated cross which is visible through the microscope, with the position of said illuminated cross relative to said reference cross depending on the angular position of the selected surface of the workpiece with respect to the reference plane.

2. Optical apparatus for facilitating adjustment of a miniature workpiece to a position in which a selected surface of the workpiece is parallel to a reference plane, said optical apparatus including in combination, a microscope having an optical axis and having a reticle forming a reference cross in a plane parallel to the reference plane, the reference cross being visible through the microscope, a non-lenticular light source providing diffuse light in the form of a cross, said light source being supported in a position offset from said optical axis and oriented so as to direct such light cross along an axis which intersects said optical axis at an angle, and support means adapted to support the workpiece with the selected surface thereof at the intersection of the optical axis and the axis of the light cross such that when the selected surface of the workpiece is parallel to the reference plane an image of the light cross is visible through the microscope and is aligned with the cross provided by the reticle, and when said selected surface is tilted with respect to the reference plane the visible image of the light cross is offset from the cross provided by the reticle.

3. Optical apparatus for facilitating adjustment of a miniature workpiece to a position in which a selected surface of the workpiece is parallel to a reference plane, said optical apparatus including in combination, a microscope having an optical axis and having reticle means which provides a reference cross in a plane parallel to the reference plane, the reference cross being visible through the microscope, a light source including an enclosure, a lamp within said enclosure, and diffusing means in the form of a cross associated with said enclosure and said lamp so as to transmit diffused light from said enclosure in the form of a cross which is substantially larger than said selected surface of said workpiece, means supporting said light source in a position offset from said optical axis and oriented so as to project the light cross along an axis which intersects said optical axis, and support means adapted to support the workpiece with the selected surface thereof at the intersection of the optical axis and the axis of the light cross such that when the selected surface of the workpiece is parallel to the reference plane an image of the light cross is visible through the microscope and is aligned with the cross provided by the reticle, and when said selected surface is tilted with respect to the reference plane the visible image of the light cross is offset from the cross provided by the reticle.

4. An optical system for use with a leveling device which is adapted to receive and adjust a workpiece to an angular position in which a planar surface of the workpiece is parallel to a reference plane, said optical system including in combination, mounting means for supporting the leveling device in a predetermined position, a microscope supported in a position such that a workpiece received by the leveling device has the planar surface thereof in the field of the microscope when the leveling device is supported by said mounting means as aforesaid, said microscope having reticle means forming a first symbol representing the reference plane and adapted to be viewed through the microscope, a non-lenticular light source providing light in the form of a second symbol which is larger than said surface of said workpiece and means supporting said light source in a position so as to direct the light from said source at the position of the planar surface of a workpiece supported as aforesaid so that an image of said second symbol can be viewed through the microscope and the position of said image relative to said first symbol as viewed through the microscope depends on the angular position of the planar surface of the workpiece with respect to the reference plane, whereby upon operation of the leveling device so as to adjust the angular position of the workpiece said image follows the movement of said planar surface, and when said planar surface is parallel to the reference plane said image has a predetermined recognizable relation to said first symbol.

5. Apparatus for viewing and positioning a workpiece having a planar-reflective portion of microscopic size in order to adjust the angular position of the workpiece with respect to a reference plane preliminary to performing work on said piece, said apparatus including in combination a lenticular optical instrument adapted for viewing a workpiece in the apparatus and having means therein forming a reference symbol which represents the reference plane, leveling means in said apparatus for supporting said workpiece in the field of view of said optical instrument, a light source providing light in the form of an alignment symbol and positioned to shine such light in said form into said field of view of said optical instrument, light-diffusing means positioned in the path of the light for diffusing said light to an extent that the alignment symbol is formed thereby in the field of said optical instrument, said alignment symbol being many times larger than the workpiece whereby the workpiece may be placed in only a roughly aligned position and still reflect a portion of the diffused light from said alignment symbol into said optical instrument to form an image of said symbol inside said optical instrument at said reference plane, the position of such image relative to said reference symbol as viewed through said instrument providing an indication of the angular position of said workpiece with respect to said reference plane, said leveling means having adjusting means therewith operable to adjust the angular position of such workpiece to a specific position at which said alignment symbol has a predetermined recognizable relation to said reference symbol, and with said specific position being that at which work is performed on such piece.

References Cited by the Examiner

UNITED STATES PATENTS

| | | | |
|---|---|---|---|
| 1,162,058 | 11/15 | Henker | 88—20 |
| 1,973,066 | 9/34 | Hauser et al. | 88—1 |
| 2,659,665 | 11/53 | Parsons et al. | 88—1 |
| 2,834,111 | 5/58 | Sweany | 88—14 |

FOREIGN PATENTS

| | | |
|---|---|---|
| 718,651 | 11/54 | Great Britain. |

JEWELL H. PEDERSEN, *Primary Examiner.*

WILLIAM MISIEK, EMIL G. ANDERSON, *Examiners.*